United States Patent [19]
Derderian

[11] Patent Number: 6,107,152
[45] Date of Patent: Aug. 22, 2000

[54] METHOD OF FORMING TUNGSTEN NITRIDE COMPRISING LAYERS USING $NF_3$ AS A NITROGEN SOURCE GAS

[75] Inventor: Garo J. Derderian, Boise, Id.

[73] Assignee: Micron Technology, Inc., Boise, Id.

[21] Appl. No.: 09/027,363

[22] Filed: Feb. 20, 1998

[51] Int. Cl.$^7$ .................................................. H01L 21/20
[52] U.S. Cl. ......................... 438/381; 438/680; 438/685; 427/255.2; 427/576; 118/723 IR
[58] Field of Search .................................... 438/239, 656, 438/680, 381, 685; 427/255.2, 576; 118/723 IR

[56] References Cited

U.S. PATENT DOCUMENTS

| | | | |
|---|---|---|---|
| Re. 35,785 | 5/1998 | Sandhu et al. | 438/681 |
| 4,022,872 | 5/1977 | Carson et al. | 423/297 |
| 4,782,032 | 11/1988 | Geissberger et al. | 437/41 |
| 4,823,182 | 4/1989 | Okumura | 357/67 |
| 4,839,311 | 6/1989 | Riley et al. | 437/228 |
| 4,847,212 | 7/1989 | Balzan et al. | 437/41 |
| 4,849,376 | 7/1989 | Balzan et al. | 437/228 |
| 4,897,709 | 1/1990 | Yokayama et al. | 357/68 |
| 4,913,929 | 4/1990 | Moslehi et al. | 427/39 |
| 4,965,218 | 10/1990 | Geissberger et al. | 437/41 |
| 5,173,449 | 12/1992 | Lorenzen et al. | 437/192 |
| 5,180,435 | 1/1993 | Markunas et al. | 118/723 |
| 5,196,360 | 3/1993 | Doan et al. | 437/41 |
| 5,248,636 | 9/1993 | Davis et al. | 437/225 |
| 5,278,448 | 1/1994 | Fujii | 257/750 |
| 5,314,843 | 5/1994 | Yu et al. | 437/225 |
| 5,350,711 | 9/1994 | Hall | 437/192 |
| 5,504,040 | 4/1996 | Moslehi | 437/225 |
| 5,506,449 | 4/1996 | Nakano et al. | 257/758 |
| 5,612,558 | 3/1997 | Harshfield | 257/298 |
| 5,622,888 | 4/1997 | Sekine et al. | 438/398 |
| 5,641,707 | 6/1997 | Moslehi | 438/513 |
| 5,930,106 | 7/1999 | Deboer et al. | 361/305 |

OTHER PUBLICATIONS

PCT publication, International Publication No. WO 98/23389 No date.

Nagayoshi et al., "Preparation of a $Si_{1-x}N_x$:H Film Using $N_2$ Microwave Afterglow Chemical Vapor Deposition Method", Jpn. J. Appl. Phys. vol. 32 (1993) PT. 1, No. 12A, p. 5791 –5795.

(List continued on next page.)

*Primary Examiner*—Wael Fahmy
*Assistant Examiner*—Kurt Eaton
*Attorney, Agent, or Firm*—Wells, St. John, Roberts, Gregory & Matkin P.S.

[57] ABSTRACT

Methods of forming tungsten-comprising layers are described. In one implementation, a substrate is provided having a surface over which a tungsten-comprising layer is to be formed. A gas plasma is generated comprising a reactive species, with the substrate not being exposed to the gas plasma. The reactive species from the gas plasma and a source gas comprising tungsten are provided into proximity with the substrate surface and under conditions which are effective to form a tungsten-comprising layer over at least a portion of the surface. In another implementation, a tungsten source gas is provided into a chamber having a substrate positioned therein. A gaseous reactive species formed from a gas plasma is provided into proximity with the substrate within the chamber and under conditions which are effective to form a layer comprising tungsten over at least a portion of the substrate. At least some of the gaseous reactive species is (are) generated by gas plasma at a plasma-generating location which is remote from the substrate. In another implementation, a layer which is predominately tungsten nitride is formed over a substrate surface within a processing chamber. At a processing location which is remote from the substrate surface, a nitrogen-comprising gas is exposed to conditions which are effective to form an activated nitrogen-comprising species from the gas. The substrate surface is exposed to a tungsten-comprising source gas and the activated nitrogen-comprising species within the chamber under conditions effective to form a layer comprising tungsten nitride over at least a portion of the surface.

27 Claims, 1 Drawing Sheet

OTHER PUBLICATIONS

Hsu et al., "Advances in Remote Plasma–enhanced Chemical Vapor Deposition for Low Temperature In Situ Hydrogen Plasma Clean and Si and $Si_{1-x}Ge_x$ Epitaxy", Journal of Electric Materials, vol. 21, No. 1, (1992), p. 65–74.

Ihara et al., "Synthesis of MoN and RuN by Active Nitrogen Sputtering", IEEE Transactions on Magnetics, vol. MAG–23, No. 2, (Mar. 1987), p. 1011–1013.

Landheer et al., "Growth and characterization of silicon nitride films produced by remote microwave plasma chemical vapor deposition", J. Vac. Sci. Technol. A 9 (5), (Sep./Oct. 1991), p. 2594–2600.

Alexandrov et al., "Remote Plasma–enhanced Chemical Vapour Deposition of Silicon Nitride Films: The Effect of Diluting Nitrogen with Helium", J. Mater. Chem, Vol. 5, (1995), p. 457–460.

Belmonte et al., "Advantages of Post–Discharges in CVD Processes", Supplement Le Vide Science Technique et Applications N° 279 Janvier–Fevier–Mars (1996), p. 170–172.

METHOD OF FORMING TUNGSTEN NITRIDE COMPRISING LAYERS USING NF₃ AS A NITROGEN SOURCE GAS

TECHNICAL FIELD

The present invention relates to methods of forming tungsten-comprising layers.

BACKGROUND OF THE INVENTION

Present techniques for forming layers comprising tungsten over a substrate have given rise to problems which include inadequate step coverage over selected topographical features. Present formation techniques limit the usefulness of such layers for forming such structures as contacts and memory cell electrodes, e.g. dynamic random access memory (DRAM) cell electrodes because of step coverage problems.

The present invention arose out of concerns associated with providing improved tungsten-comprising layers and formation techniques.

SUMMARY OF THE INVENTION

Methods of forming tungsten-comprising layers are described. In one implementation, a substrate is provided having a surface over which a tungsten-comprising layer is to be formed. A gas plasma is generated comprising a reactive species, with the substrate not being exposed to the gas plasma. The reactive species from the gas plasma and a source gas comprising tungsten are provided into proximity with the substrate surface and under conditions which are effective to form a tungsten-comprising layer over at least a portion of the surface. In another implementation, a tungsten source gas is provided into a chamber having a substrate positioned therein. A gaseous reactive species formed from a gas plasma is provided into proximity with the substrate within the chamber and under conditions which are effective to form a layer comprising tungsten over at least a portion of the substrate. At least some of the gaseous reactive species is (are) generated by gas plasma at a plasma-generating location which is remote from the substrate. In another implementation, a layer which is predominately tungsten nitride is formed over a substrate surface within a processing chamber. At a processing location which is remote from the substrate surface, a nitrogen-comprising gas is exposed to conditions which are effective to form an activated nitrogen-comprising species from the gas. The substrate surface is exposed to a tungsten-comprising source gas and the activated nitrogen-comprising species within the chamber under conditions effective to form a layer comprising tungsten nitride over at least a portion of the surface.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
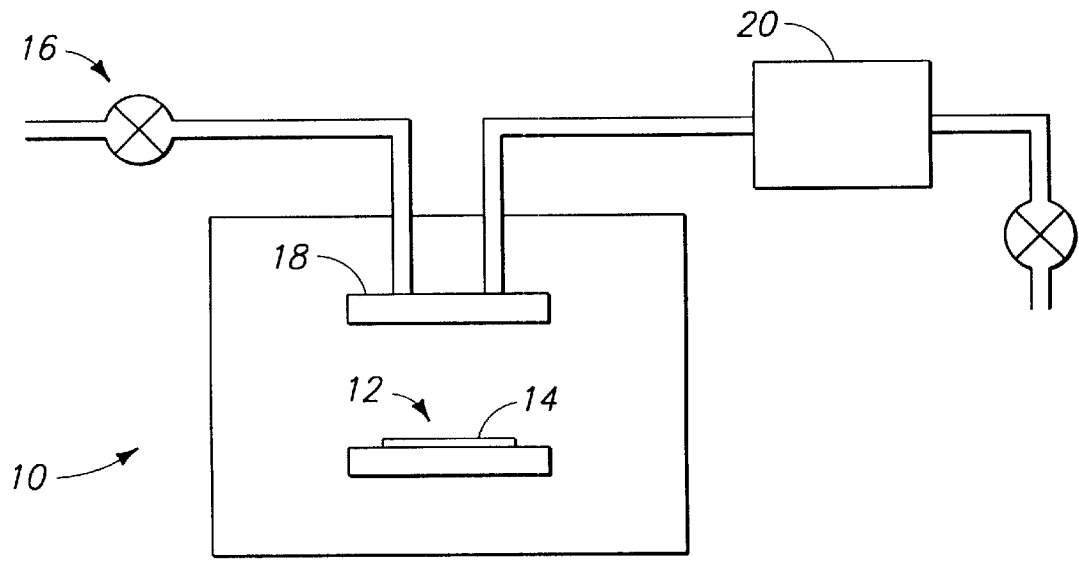
FIG. 1 is a schematic view of an exemplary processing chamber in which remote plasma enhanced chemical vapor deposition (RPECVD) can take place in accordance with one implementation of the invention.

Referring to FIG. 1, a processing chamber is indicated generally at 10 and comprises one in which remote plasma enhanced chemical vapor deposition (RPECVD) can take place. Key features of remote plasma chemical vapor deposition which make it different from conventional plasma chemical vapor deposition include: (1) in most cases the plasma is remote from the substrate, i.e. the substrate is not immersed in the plasma, and (2) not all of the gases are submitted to direct plasma excitation. To that extent, the illustrated chamber is intended for descriptive purposes only and is not intended to limit the invention or methodologies provided thereby in any way. Accordingly, other reactors and/or chambers can be utilized. Exemplary reactors and chambers are described in a text entitled "Principles of Plasma Discharges and Materials Processing" authored by Lieberman and Lichtenberg and published by John Wiley and Sons, Inc., the disclosure of which is incorporated by reference. Other references which discuss processing apparatuses and regimes which utilize remote plasma include: U.S. Pat. No. 5,180,435 entitled "Remote Plasma Enhanced CVD Method and Apparatus for Growing an Epitaxial Semiconductor Layer; "Preparation of a-Si$_{1-x}$N$_x$:H Film Using N$_2$ Microwave Afterglow Chemical Vapor Deposition Method" by Nagayoshi et al., published in Jpn. J. Appl. Phys. Vol. 32 (1993) Pt. 1 No. 12A; "Advances in Remote Plasma-enhanced Chemical Vapor Deposition for Low Temperature In Situ Hydrogen Plasma Clean and Si and Si$_{1-x}$Ge$_x$ Epitaxy" by Hsu et al., published in The Journal of Electronic Materials, Vol. 21, No. 1 (1992); "Synthesis of MoN and RuN by Active Nitrogen Sputtering" by Ihara et al., published in IEEE Transactions on Magnetics, Vol. MAG 23, No. 2, March 1987; "Growth and Characterization of Silicon Nitride Films Produced by Remote Microwave Plasma Chemical Vapor Deposition", by Landheer et al., published in J. Vac. Sci. Technol. A 9 (5), September/October 1991; "Remote Plasma-enhanced Chemical Vapour Deposition of Silicon Nitride Films: The Effect of Diluting Nitrogen with Helium", by Alexandrov et al., published in J. Mater. Chem. 1995, Vol. 5; and "Advantages of Post-Discharges in CVD Processes", by Belmonte et al., published in supplement Le Vide science technique et applications N° 279 Janvier-Fevrier-Mars 1996, the disclosures of which are incorporated by reference herein.

Within chamber 10 a substrate 12 is provided having a surface 14 over which a layer comprising tungsten is to be formed. A tungsten gas source 16 is provided and carries a source gas comprising tungsten into chamber 10 through a gas dispersal mechanism such as shower head 18. Such enables the tungsten source gas to be provided into proximity with substrate surface 14. Exemplary tungsten source gases include tungsten fluoride (WF$_6$), WCl$_x$, W(CO)$_6$, and WBr$_x$.

A remote gas plasma is separately generated and includes gaseous reactive or activated species. The produced species can include ions, electrons, and a host of excited species all with different composite lifetimes which are influenced by various factors. The produced species are subsequently provided, along with the tungsten source gas, into proximity with substrate surface 14 under conditions which are effective to form a layer comprising tungsten over at least a portion of the surface. Exemplary processing conditions include, in an Applied Centura reactor, pressures between about 0.4 to 30 Torr, temperatures between 200° C. and 500° C., nitrogen source between 1000 to 3000 sccm, with remote plasma generation power from 1800 W to 6000 W. Any suitable method of forming a remote plasma, and various types of processing chambers configured for remote plasma operation can be utilized. Examples of such methods and processing chambers are described in the references incorporated above.

In one aspect, substrate 12 is not exposed to, or immersed in the gas plasma, but rather is only exposed to the reactive species. Accordingly, a processing location 20 can be provided which is remote from substrate surface 14. A gas plasma can be generated by subjecting a suitable gas to conditions which are effective to form an activated species. Exemplary processing scenarios are described in the references incorporated above and can include RF processing and/or microwave processing the gas. At least some of the gaseous reactive species which ultimately react with the tungsten source gas can be generated at this location. Other of the reactive species generated at this location can be annihilated before reaching the substrate. An Applied Centura reactor with remote plasma generator can be used.

In one aspect, the gas which is processed at location 20 comprises hydrogen which is preferably provided into a metastable state in which various reactive species can be present. The reactive species preferably react with the tungsten source gas to form a layer comprising predominantly tungsten. In another aspect, the reactive species is generated from $N_2$ and comprises nitrogen in a metastable state. In another aspect, the reactive species can comprise both hydrogen and nitrogen. In yet another aspect, nitrogen-comprising reactive species can be generated from a compound selected from the group consisting of $NF_3$, $NH_3$, and $NCl_3$, and mixtures thereof. Such nitrogen-comprising species are exposed with the tungsten source gas under conditions which are effective to form a layer comprising predominantly tungsten nitride over at least a portion of surface 14.

Figure 2:
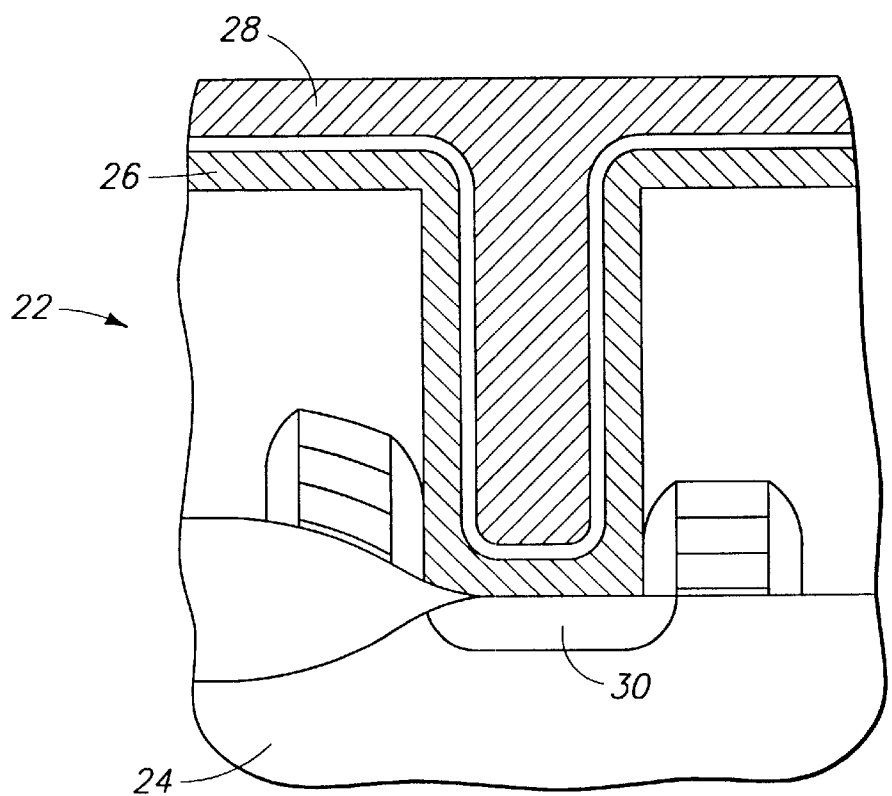
FIG. 2 is a diagrammatic sectional view of a semiconductor wafer fragment in accordance with one aspect of the invention.

Referring to FIG. 2, a wafer fragment is indicated generally at 22 and comprises, in this example, a portion of a substrate 24 over which capacitor plates 26, 28 are deposited. Either of the capacitor plates can be formed or deposited utilizing the methodologies described above. In the illustrated example, the capacitor plates are formed in connection with DRAM circuitry. In another implementation, plate 26 can constitute a contact which is formed to be in electrical communication with a node location 30.

The methodologies described above provide tungsten and tungsten-comprising layers which have improved step coverage. Such layers are particularly well suited in applications where contacts and electrodes, e.g. cell electrodes in DRAM capacitors, are desired to be formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a tungsten nitride comprising layer comprising:

providing a substrate having a surface;

generating a gas plasma comprising a reactive species, wherein said reactive species is generated from $NF_3$, $NCl_3$, a mixture of $NF_3$ and $NCl_3$, a mixture of $NCl_3$ and $NH_3$ or a mixture of $NF_3$ and $NH_3$, said substrate not being exposed to said gas plasma; and providing said reactive species from the gas plasma and a source gas comprising tungsten into proximity with said surface and under conditions which are effective to form a tungsten-comprising layer over at least a portion of said surface.

2. The method of forming a tungsten-comprising layer of claim 1, wherein said source gas comprises $WF_6$.

3. The method of forming a tungsten-comprising layer of claim 1, wherein said reactive species comprises nitrogen.

4. The method of forming a tungsten-comprising layer of claim 3, wherein said reactive species comprises nitrogen in a metastable state.

5. A method of forming a tungsten nitride comprising layer comprising:

providing a tungsten source gas into a chamber having a substrate positioned therein; and providing a gaseous reactive species formed from a gas plasma, said reactive species is generated from $NF_3$, $NCl_3$, a mixture of $NF_3$ and $NCl_3$, a mixture of $NCl_3$ and $NH_3$ or a mixture of $NF_3$ and $NH_3$, into proximity with said substrate within the chamber and under conditions which are effective to form a layer comprising tungsten over at least a portion of the substrate, at least some of said gaseous reactive species being generated by gas plasma at a plasma-generating location remote from said substrate.

6. The method of claim 5, wherein said providing of said gaseous reactive species comprises not exposing said substrate to said gas plasma.

7. The method of claim 5, wherein said plasma-generating location is remote from said chamber.

8. The method of claim 5, wherein said tungsten source gas comprises $WF_6$.

9. The method of claim 5, wherein said gaseous reactive species comprises nitrogen.

10. The method of claim 9, wherein said gaseous reactive species comprises nitrogen in a metastable state.

11. A method of forming a predominately tungsten nitride layer comprising:

providing a substrate within a chamber, said substrate having a surface;

at a processing location remote from said surface, exposing a nitrogen-comprising gas to conditions effective to form an activated nitrogen-comprising species from said gas, said activated nitrogen being generated from NF3, NCl3, a mixture of NF3 and NCl3, a mixture of NCl3 and NH3 or a mixture of NF3 and NH3, and exposing said surface to a tungsten-comprising source gas and said activated nitrogen-comprising species within the chamber under conditions which are effective to form a layer comprising tungsten over at least a portion of said surface.

12. The method of claim 11, wherein said processing location is remote from said chamber.

13. The method of claim 11, wherein said exposing of said nitrogen-comprising gas comprises generating a gas plasma from said nitrogen-comprising gas.

14. The method of claim 13, wherein said generating of said gas plasma comprises generating said gas plasma outside of said chamber.

15. The method of claim 11, wherein said tungsten source gas comprises $WF_6$.

16. A capacitor forming method comprising:

providing a substrate having a surface over which a capacitor plate is to be deposited; and depositing a capacitor plate over said surface by generating a gas plasma comprising a reactive species, wherein said reactive species is generated from $NF_3$, $NCl_3$, a mixture of $NF_3$ and $NCl_3$, a mixture of $NCl_3$ and $NH_3$ or a mixture of $NF_3$ and $NH_3$, and wherein said substrate is not exposed to said gas plasma, and providing said reactive species from said gas plasma and a source gas comprising tungsten into proximity with said surface and under conditions which are effective to form a tungsten-comprising capacitor plate over at least a portion of said surface.

17. A capacitor forming method comprising:

providing a tungsten source gas into a chamber having a substrate positioned therein over which a capacitor plate is to be deposited; and providing a gaseous reactive species formed from a gas plasma into proximity with said substrate within the chamber and under conditions which are effective to deposit a capacitor plate comprising tungsten over at least a portion of the substrate, at least some of said gaseous reactive species being generated by said gas plasma at a plasma-generating location remote from said substrate and wherein said reactive species is generated from $NF_3$, $NCl_3$, a mixture of $NF_3$ and $NCl_3$, a mixture of $NCl_3$ and $NH_3$ or a mixture of $NF_3$ and $NH_3$.

18. A capacitor forming method comprising:

providing a substrate within a chamber, said substrate having a surface over which a capacitor plate is to be deposited;

at a processing location remote from said surface, exposing a nitrogen-comprising gas to conditions effective to form an activated nitrogen-comprising species from said gas, wherein said reactive species is generated from $NF_3$, $NCl_3$, a mixture of $NF_3$ and $NCl_3$, a mixture of $NCl_3$ and $NH_3$ or a mixture of $NF_3$ and $NH_3$, and exposing said surface to a tungsten-comprising source gas and said activated nitrogen-comprising species within the chamber under conditions which are effective to form a capacitor plate comprising tungsten nitride over at least a portion of said surface.

19. A contact forming method comprising:

providing a substrate having a node location with which electrical communication is desired; and forming a contact in electrical communication with said node location by generating a gas plasma comprising a reactive species wherein said substrate is not exposed to said gas plasma, and providing said reactive species from said gas plasma, said reactive species generated from $NF_3$, $NCl_3$, a mixture of $NF_3$ and $NCl_3$, a mixture of $NCl_3$ and $NH_3$ or a mixture of $NF_3$ and $NH_3$, and a source gas comprising tungsten into proximity with said surface and under conditions which are effective to form a tungsten-comprising contact in electrical communication with said node location.

20. The method of forming a predominately tungsten nitride layer of claim 11, wherein said reactive species comprises nitrogen in a metastable state.

21. The capacitor forming method of claim 16, wherein said source gas comprises $WF_6$.

22. The capacitor forming method of claim 16, wherein said reactive species comprises nitrogen in a metastable state.

23. The capacitor forming method of claim 17, wherein said tungsten source gas comprises $WF_6$.

24. The capacitor forming method of claim 18, wherein said tungsten-comprising source gas comprises $WF_6$.

25. The capacitor forming method of claim 18, wherein said activated nitrogen-comprising species comprises nitrogen in a metastable state.

26. The contact forming method of claim 19, wherein said source gas comprises $WF_6$.

27. The contact forming method of claim 19, wherein said reactive species comprises nitrogen in a metastable state.

* * * * *